United States Patent
Towle

(10) Patent No.: US 6,762,435 B2
(45) Date of Patent: Jul. 13, 2004

(54) SEMICONDUCTOR DEVICE WITH BORON CONTAINING CARBON DOPED SILICON OXIDE LAYER

(75) Inventor: Steven N. Towle, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/458,003

(22) Filed: Jun. 9, 2003

(65) Prior Publication Data

US 2003/0211325 A1 Nov. 13, 2003

Related U.S. Application Data

(62) Division of application No. 09/717,517, filed on Nov. 20, 2000, now Pat. No. 6,610,362.

(51) Int. Cl.[7] .............................................. H01L 31/256
(52) U.S. Cl. ........................ 257/76; 428/408; 428/446; 428/698; 428/704
(58) Field of Search ..................... 257/77, 76; 428/408, 428/446, 704, 698

(56) References Cited

U.S. PATENT DOCUMENTS

| | | | |
|---|---|---|---|
| 4,517,223 A | | 5/1985 | Ovshinsky et al. |
| 4,568,614 A | * | 2/1986 | Eichen et al. |
| 4,954,182 A | | 9/1990 | Ovshinsky et al. |
| 5,530,581 A | | 6/1996 | Cogan |
| 5,563,102 A | * | 10/1996 | Michael |
| 5,750,210 A | | 5/1998 | Schmidt et al. |
| 5,753,936 A | | 5/1998 | Komatsu et al. |
| 5,886,368 A | * | 3/1999 | Forbes et al. |
| 5,926,740 A | | 7/1999 | Forbes et al. |
| 6,028,264 A | | 2/2000 | Yamazaki |
| 6,159,871 A | | 12/2000 | Loboda et al. |
| 6,258,735 B1 | | 7/2001 | Xia et al. |
| 6,316,063 B1 | | 11/2001 | Andideh et al. |
| 6,350,670 B1 | | 2/2002 | Andideh et al. |
| 6,350,704 B1 | | 2/2002 | Ahn et al. |
| 6,362,091 B1 | | 3/2002 | Andideh et al. |
| 6,410,462 B1 | | 6/2002 | Yang et al. |
| 6,436,822 B1 | | 8/2002 | Towle |
| 6,465,372 B1 | | 10/2002 | Xia et al. |

* cited by examiner

Primary Examiner—Archene Turner
(74) Attorney, Agent, or Firm—Blakely, Sokoloff, Taylor & Zafman LLP

(57) ABSTRACT

A method of forming a carbon doped oxide layer on a substrate is described. That method comprises introducing into a chemical vapor deposition apparatus a source of carbon, silicon, boron, and oxygen. That apparatus is then operated under conditions that cause a boron containing carbon doped oxide layer to form on the substrate.

2 Claims, 1 Drawing Sheet

SEMICONDUCTOR DEVICE WITH BORON CONTAINING CARBON DOPED SILICON OXIDE LAYER

This is a Divisional Application of Ser. No.: 09/717,517 filed Nov. 20, 2000, now U.S. Pat. No. 6,610,362.

FIELD OF THE INVENTION

The present invention relates to a method of forming a carbon doped oxide layer on a substrate, e.g., a substrate used to make a semiconductor device.

BACKGROUND OF THE INVENTION

Semiconductor devices include metal layers that are insulated from each other by dielectric layers. As device features shrink, reducing the distance between the metal layers and between metal lines on each layer, capacitance increases. To address this problem, insulating materials that have a relatively low dielectric constant are being used in place of silicon dioxide (and other materials that have a relatively high dielectric constant) to form the dielectric layer that separates the metal lines.

A material that may be used to form such a low k dielectric layer is carbon doped oxide ("CDO"). Using this material instead of silicon dioxide to separate metal lines may yield a device having reduced propagation delay, crosstalk noise and power dissipation. A conventional process for forming a CDO layer yields a material that has a dielectric constant of about 3.0. In some circumstances, it may be desirable to further reduce the dielectric constant for that layer.

Accordingly, there is a need for an improved process for making a carbon doped oxide insulating layer. There is a need for such a process that generates a CDO material with a reduced dielectric constant, which can be easily integrated into existing processes for making semiconductors. The method of the present invention provides such a process.

DETAILED DESCRIPTION OF THE PRESENT INVENTION

Figure 1:
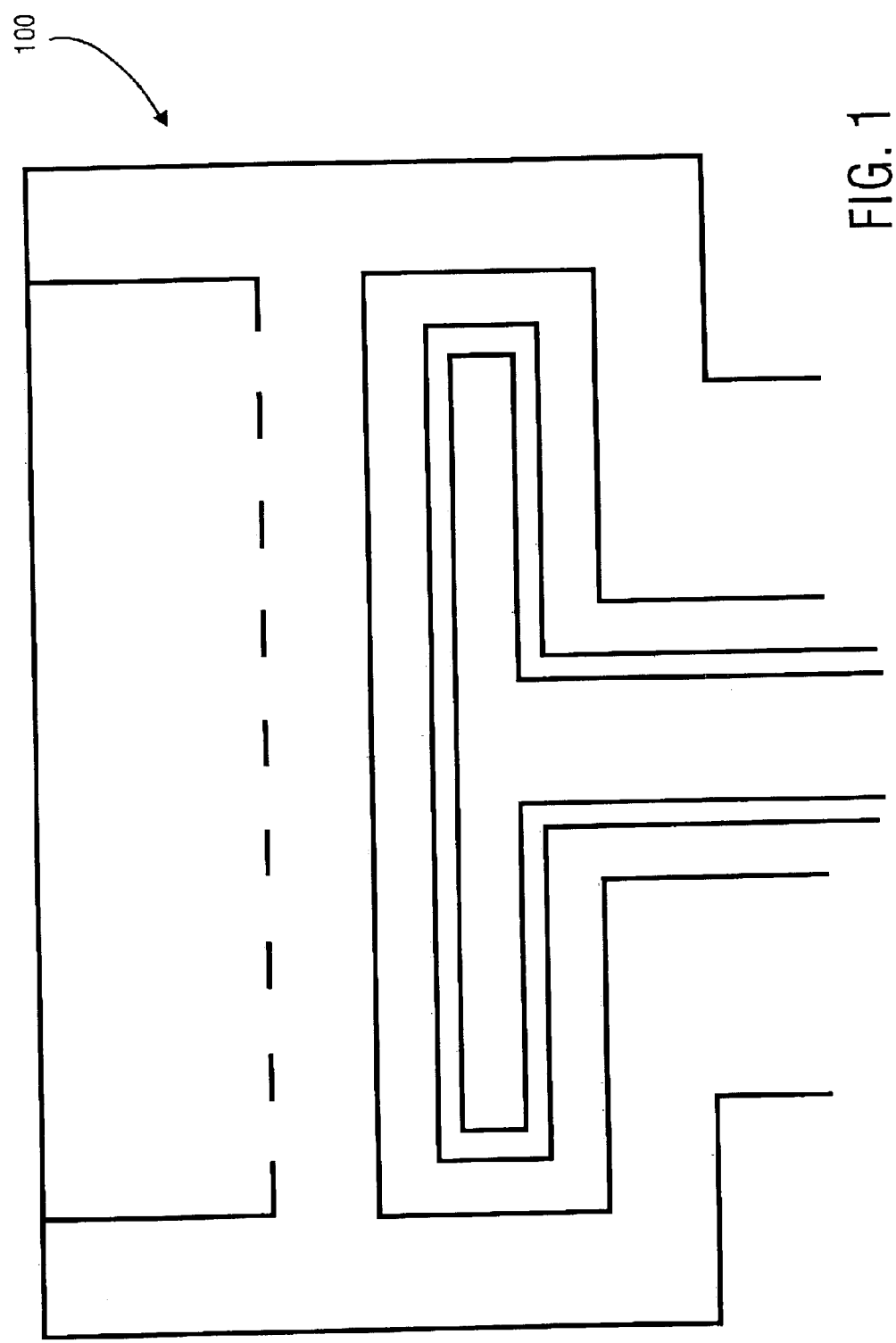
FIG. 1 provides a schematic representation of a CVD chamber for a PECVD reactor.

A method is described for forming a carbon doped oxide layer on a substrate. That method comprises introducing into a chemical vapor deposition apparatus sources of carbon, silicon, boron and oxygen, then operating that apparatus under conditions that cause a boron containing carbon doped oxide layer to form on the substrate. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In the method of the present invention, a substrate, e.g., a silicon wafer upon which various conducting and insulating layers may have been formed, is placed in a chemical vapor deposition apparatus—preferably a PECVD reactor, e.g., PECVD reactor 100 illustrated in FIG. 1. To form a CDO layer on such a substrate, in accordance with the method of the present invention, gases that provide a source of carbon, silicon, boron and oxygen are introduced into the reactor. Those gases may be fed into reactor 100 in the conventional manner.

Gases that may provide a source of carbon and silicon include alkyl silane and alkyl oxysilane precursors, for example, methylsilane, dimethylsilane, trimethylsilane, tetramethylsilane, methyltrimethoxysilane, dimethyldimethoxysilane, trimethylmethoxysilane, methyl phenyl dimethoxysilane, diphenyl dimethoxysilane, and octamethyl cyclotetrasiloxane, as well as others that are well known to those skilled in the art. Gases that provide a source of boron include diborane, borazine, tetraborane, decaborane, methoxydiethylborane, triethylborane, as well as many others.

A first gas, which provides the source of silicon and carbon, and a second gas, which provides the source of boron and perhaps also carbon, may be introduced into the PECVD reactor in the same gas stream or different gas streams. Note that while these substances are introduced as gases, they may be liquids at standard temperature and pressure. When an alkyl silane is used as the silicon/carbon source, oxygen or nitrous oxide may be included in the gas stream as a source of oxygen. A ratio of the first gas to the second gas, as fed into the reactor, should be chosen to ensure that the resulting boron containing CDO layer contains between about 3 and about 20 atom % boron and between about 5 and about 50 atom % carbon (both exclusive of hydrogen content), and more preferably includes between about 5 and about 15 atom % boron and between about 20 and about 35 atom % carbon (exclusive of hydrogen content). In addition, that layer preferably has a dielectric constant that is less than or equal to about 2.8.

In some cases, it may be desirable to feed helium, argon, or nitrogen into the reactor—in addition to the gases that provide the source of silicon, carbon, boron, and oxygen, as is well understood by those skilled in the art. The presence of carbon in the CDO layer renders that layer hydrophobic even at relatively high levels of boron content. Without the presence of carbon, boron doped silicon dioxide glass is highly hydroscopic, greatly reducing its utility as a low-k dielectric material. Process steps that follow deposition of such a boron containing CDO layer (e.g., etching, ashing, and cleaning steps) should be performed in a way that maintains this hydrophobic property.

The PECVD reactor may be operated at conventional temperatures, pressures, radio frequency and power. Optimal operating conditions may, of course, depend upon the composition of the gas streams fed into the reactor, the type of reactor used, and the desired properties for the resulting boron containing CDO layer. After the CDO layer is deposited, it may be desirable to apply an annealing step to outgas volatile species, e.g., water, hydrogen and other low molecular weight substances. The temperature chosen for such an annealing step should ensure that the material can withstand the demands that subsequent process steps impose on it. In some applications, applying a temperature of about 400° C. for about 10 minutes should be adequate.

By adding boron to a PECVD deposited CDO layer, the method of the present invention should reduce the layer's dielectric constant, which may improve semiconductor device performance. Although the foregoing description has specified certain steps, materials, and equipment that may be used in such a method, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A semiconductor device comprising:
 a substrate covered by a boron containing carbon doped silicon oxide layer, the boron containing carbon doped silicon oxide layer consisting essentially of silicon, oxygen, hydrogen, and between about 5 and about 15 atom % boron and between about 20 and about 35 atom % carbon, exclusive of hydrogen content;
 wherein the boron containing carbon doped silicon oxide layer has a dielectric constant that is less than about 2.8 and is used as an insulating layer between metal lines.

2. A semiconductor device comprising a boron containing carbon doped silicon oxide layer that is made by:
 introducing into a chemical vapor deposition apparatus a first gas that comprises an alkyl oxysilane and a second gas that comprises a source of boron; then
 operating the apparatus under conditions that cause a boron containing carbon doped silicon oxide layer to form on a substrate,
 wherein the ratio of the first gas to the second gas, as introduced into the chemical vapor deposition apparatus, ensures that the resulting boron containing carbon doped silicon oxide layer contains between about 5 and about 15 atom % boron and between about 20 and about 35 atom % carbon, exclusive of hydrogen content.

* * * * *